United States Patent [19]

Ishikawa et al.

[11] Patent Number: 4,843,334

[45] Date of Patent: Jun. 27, 1989

[54] FREQUENCY DEMODULATOR OPERABLE WITH LOW FREQUENCY MODULATION CARRIERS

[75] Inventors: Hisashi Ishikawa; Katsuji Yoshimura, both of Kanagawa, Japan

[73] Assignee: Canon Kabushiki Kaisha, Tokyo, Japan

[21] Appl. No.: 127,658

[22] Filed: Dec. 2, 1987

[30] Foreign Application Priority Data

Dec. 9, 1986 [JP] Japan ............................. 61-291519
Dec. 9, 1986 [JP] Japan ............................. 61-291520

[51] Int. Cl.$^4$ ............................................. H03D 3/00
[52] U.S. Cl. ..................................... 329/122; 358/23
[58] Field of Search ................ 329/50, 110, 122, 126; 455/214, 334; 358/23, 24

[56] References Cited

U.S. PATENT DOCUMENTS

3,867,620  2/1975  Coor ............................... 329/50 X
4,395,735  7/1983  Holmes ........................... 358/23 X
4,562,404 12/1985  Futakuchi ....................... 358/23 X Primary Examiner—Eugene R. LaRoche
Assistant Examiner—Robert J. Pascal
Attorney, Agent, or Firm—Robin, Blecker & Daley

[57] ABSTRACT

A frequency demodulating device is arranged to supply a frequency modulated signal and a separately generated signal to an analog multiplying circuit and to perform frequency demodulation by supplying the output signal of the analog multiplying circuit to a frequency demodulation circuit via a high-pass filter.

12 Claims, 7 Drawing Sheets

FREQUENCY DEMODULATOR OPERABLE WITH LOW FREQUENCY MODULATION CARRIERS

BACKGROUND OF THE INVENTION

1. Field of the Invention

This invention relates to a frequency demodulating device and more particularly to a device using a low frequency carrier wave in frequency demodulating a frequency modulated signal.

2. Description of the Related Art

Apparatuses for recording or reproducing (or transmitting) signals by frequency modulating them using low frequency carrier waves, such as video tape recorders, have been arranged to demodulate for reproduction the frequency modulated signals, for example, by a pulse counter demodulating method in which the frequency modulated wave is demodulated with a pulse counter after it is twice stepped up through full-wave differentiation or by a quadrature demodulating method.

Figure 1:
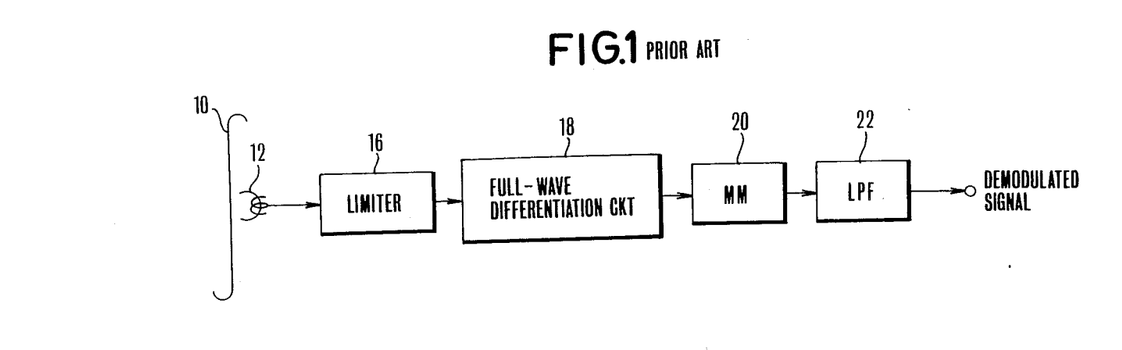
FIG. 1 is a block diagram showing by way of example the arrangement of the conventional frequency demodulating device.

FIG. 1 of the accompanying drawings shows by way of example the arrangement of the conventional frequency demodulating device of a video tape recorder (hereinafter referred to as VTR). The conventional device has been arranged as follows: A frequency modulated signal is reproduced from a magnetic tape 10 by means of a magnetic head 12. The reproduced signal which has the lowest frequency fc of a carrier is supplied to a limiter 16. The limiter 16 restricts the signal to a given amplitude. A full-wave differentiation circuit 18 full-wave differentiates the output of the limiter 16. The circuit 18 then detects the rise and fall edges of the output of the limiter 16. The full-wave differentiation circuit 18 produces a frequency modulated signal with a carrier frequency of 2 fc. The output of the circuit 18 is applied to a monostable multivibrator 20 (hereinafter referred to as MM). The MM 20 converts the frequency modulated signal into a pulse train of a given pulse width. The output of the MM 20 is supplied to a low-pass filter 22 (hereinafter referred to as LPF). The LPF 22 produces a demodulated signal.

Figures 2A, 2B:
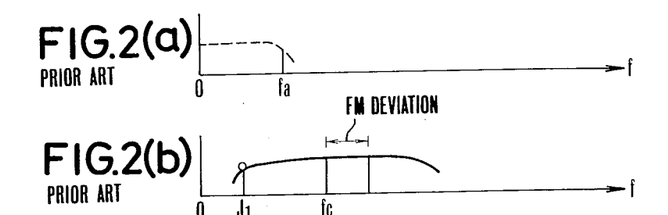
FIGS. 2(a) to 2(c) show the frequency spectra of signals produced from various parts of FIG. 1.
Figure 2C:
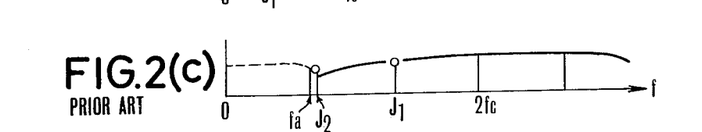

In the frequency demodulating device which is arranged in this manner, a higher portion of a lower side wave enters into the band of the demodulated signal to cause a distortion (or a moiré in the case of a video signal). More specifically, assuming that the signal to be recorded is a video signal of a frequency band as indicated by a broken line in FIG. 2(a) and that the highest frequency of the band is fa, the frequency occupying band of a frequency modulated signal obtained by frequency modulating the above stated recording signal becomes as shown in FIG. 2(b). In FIG. 2(b), a reference symbol fc denotes the lowest frequency of the carrier used for the frequency modulation and indicates the lowest frequency within an FM deviation. The frequency of a first lower-side wave J1 is fc - fa. A signal obtained by demodulating the frequency modulated signal of FIG. 2(b) with a known ordinary 2-step-up pulse counter demodulator which is as shown in FIG. 1 and the frequency spectrum distribution of the demodulated signal are as shown in FIG. 2(c). In the demodulated signal, the frequency modulation carrier frequency is increased to 2 fc by a 2-step-up action. As a result, there arise first and second lower-side waves J1 and J2. The frequency of the first lower-side wave J1 is 2 fc - fa, and the frequency of the second lower-side wave J2 is 2 fc - 2 fa. If the frequency of 2 fc - 2 fa is not higher than the frequency fa, or if the frequency fc is somewhat higher than a frequency 3 fa/2, the second lower-side wave J2 would enter the band of the demodulated signal, as shown in FIG. 2(c). Then, in the case of a video signal, this causes a moiré. Further, with the frequency modulated signal 2-step-up multiplied, the deviation doubles to double thereby the energy of the second lower-side wave J2. Therefore, this makes the moiré more conspicuous. To avoid this, if the frequency modulation is arranged to be carried out with the frequency fc set at a value higher than 3 fa/2, the highest frequency fa of the video signal or the like would become too high for a frequency band recordable by a magnetic recording and/or reproducing apparatus.

Figure 3A:
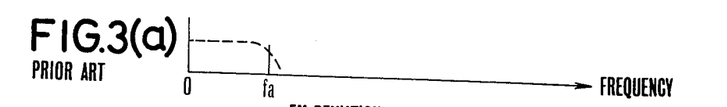
FIGS. 3(a) to 3(c) show the operating principle of the conventional 4-step-up demodulating device.
Figure 3B:
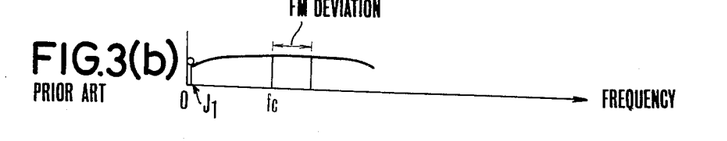
Figure 3C:
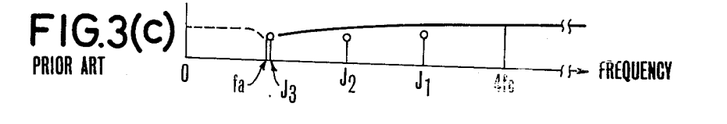

In view of this problem, a 4-step-up demodulating device has been proposed to permit frequency modulation at fc < 3 fa/2, fc > fa (Japanese Laid-Open Patent Application No. SHO 61-8771). FIGS. 3(a) to 3(c) show frequency allocation made by the frequency modulating and demodulating method of this 4-step-up demodulating device. FIG. 3(a) shows the frequency spectrum distribution of a signal to be frequency modulated. FIG. 3(b) shows the frequency spectrum distribution band of the frequency modulated wave. FIG. 3(c) shows the frequency spectrum distribution obtained with the frequency modulated wave of FIG. 3(b) stepped up by four times. Through the 4-stepping up process, the frequency modulation carrier frequency becomes 4 fc. There arise a first lower-side wave J1, a second lower-side wave J2 and a third lower-side wave J3. The frequency of the first lower-side wave J1 is 4 fc - fa. That of the second lower-side wave J2 is 4 fc - 2 fa. That of the third lower-side wave J3 is 4 fc - 3 fa. In order to prevent the third lower-side wave J3 from entering the band of a demodulated signal, indicated by a broken line in FIG. 3(c), these frequencies are arranged to be in the following relation: fa < 4 fc - 3 fa. Therefore, fc > fa. In other words, in accordance with this 4-step-up demodulation method, the frequency modulation carrier frequency fc which is the lower limit frequency of FM deviation as shown in FIG. 3(b) is arranged to be higher than the highest frequency fa of information to be recorded or transmitted. This arrangement not only improves the S/N ratio of reproduced signal but also permits use of a narrow transmission route.

Figure 4:
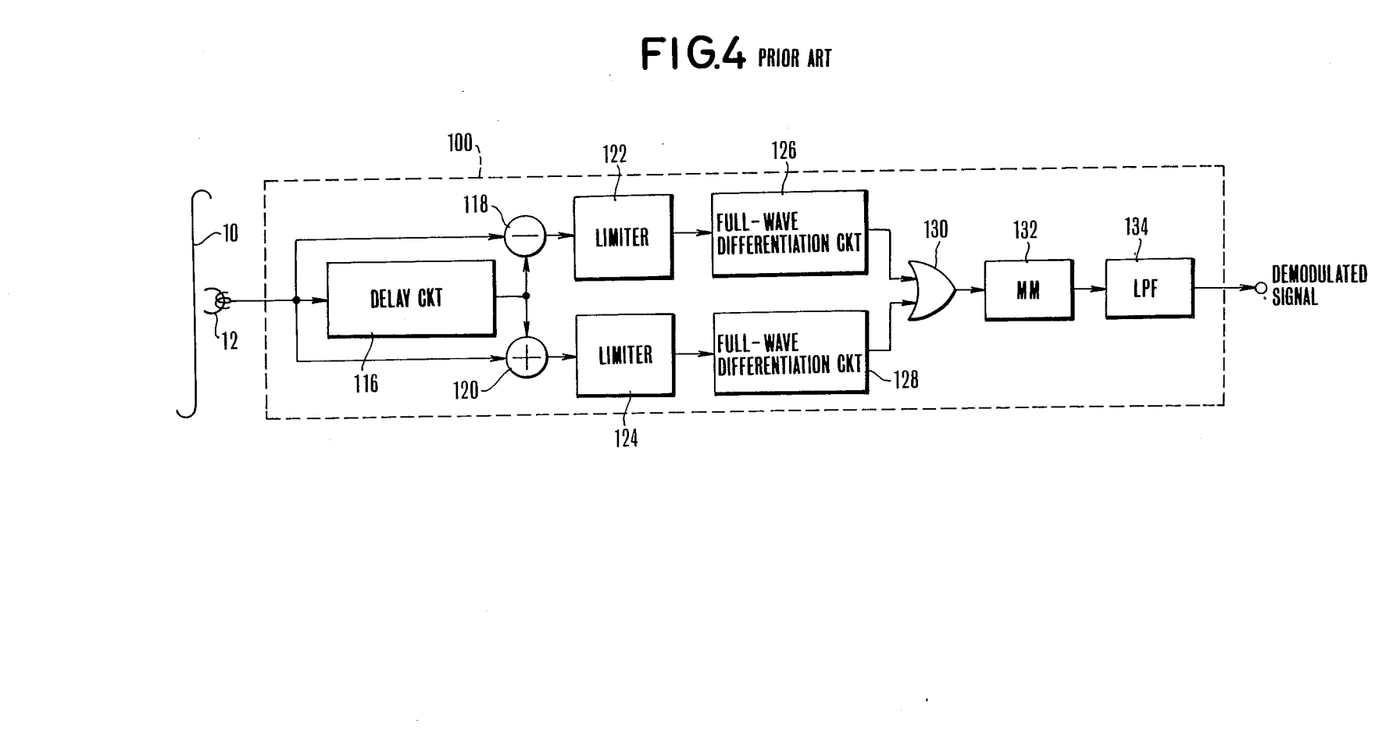
FIG. 4 is a diagram showing the arrangement of the conventional 4-step-up demodulating device.

FIG. 4 shows by way of example the arrangement of a VTR which is of the kind arranged to frequency modulate a luminance signal, to convert a carrier chrominance signal to a lower band and to record them in a multiplexing manner. The VTR has the above stated 4-step-up demodulating device employed in the luminance signal reproducing system thereof. A reference numeral 100 denotes the 4-step-up demodulating device. A frequency modulated luminance signal which is reproduced from a magnetic tape 10 by a magnetic head 12 is supplied to a transversal type phase shifter which is formed jointly by a delay circuit 116, a subtracter 118 and an adder 120.

The operating principle of the transversal type phase shifter is briefly described as follows: Assuming that a signal supplied to the delay circuit 116, the subtracter 118 and the adder 120 is expressed as Fa, the output of the delay circuit as Fb, that of the subtracter 118 as Fx, that of the adder 120 as Fy, an angular frequency as $\omega$ and the delay time of the delay circuit 116 as T, there obtain the following relations:

$$
\begin{aligned}
Fx &= Fa(\omega) - Fb(\omega) \\
&= Fa(\omega) - Fa(\omega)\,e^{-j\omega T} \\
&= Fa(\omega)(e^{j\omega T/2} - e^{-j\omega T/2}) \cdot e^{-j\omega T/2} \\
&= 2\,Fa(\omega)\sin(\omega T/2) \cdot e^{-j\omega T/2 + j\pi/2}
\end{aligned} \quad (1)
$$

$$
\begin{aligned}
Fy &= Fa(\omega) + Fb(\omega) \\
&= Fa(\omega) + Fa(\omega)\,e^{-j\omega T} \\
&= Fa(\omega)(e^{j\omega T/2} + e^{-j\omega T/2}) \cdot e^{-j\omega T/2} \\
&= 2\,Fa(\omega)\cos(\omega T/2) \cdot e^{-j\omega T/2}
\end{aligned} \quad (2)
$$

The sin term of Formula (1) and the cos term of Formula (2) above represent the frequency characteristics of this phase shifting circuit. The exponential terms of Formulas (1) and (2) represent the phasic characteristics of the circuit. As obvious from Formulas (1) and (2), the phase of the output Fx is shifted 90 degrees from that of the output Fy.

Figure 5A:
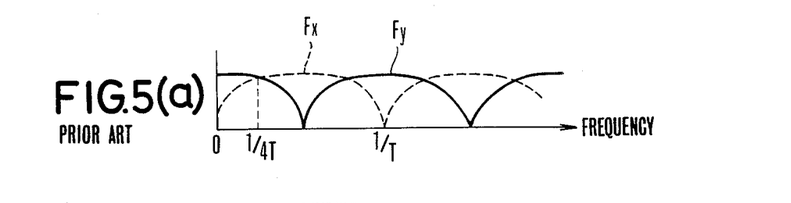
FIGS. 5(a) and 5(b) show the frequency characteristics of signals produced from the various parts of the device of FIG. 4.
Figure 5B:
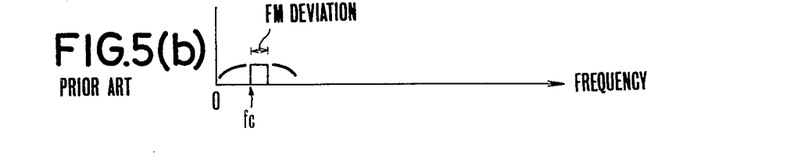

FIG. 5(a) shows the frequency-amplitude characteristics of the outputs Fx and Fy. The delay time T of the delay circuit 116 is set at such a value that causes the center frequency of the frequency modulation carrier to be ¼ T. FIG. 5(b) shows frequency modulation frequency allocation corresponding to FIG. 5(a).

Figure 6A:
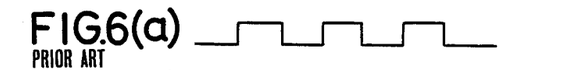
FIGS. 6(a) to 6(f) show in a timing chart the wave forms of the signals produced from the various parts of the device of FIG. 4.
Figure 6B:
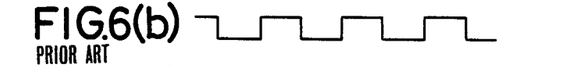
Figure 6C:
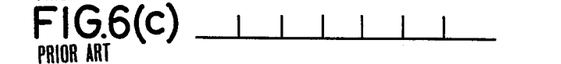
Figure 6D:
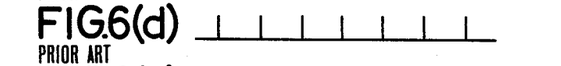
Figure 6E:
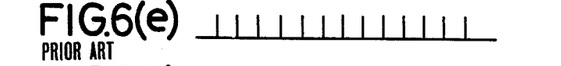
Figure 6F:
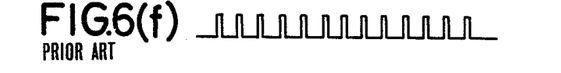

The output Fx of the subtracter 118 is amplitude limited by the limiter 122. The output Fy of the adder 120 is amplitude limited by another limiter 124. The outputs of the limiters 122 and 124 are as schematically represented in FIG. 6(a) and 6(b). They are full-wave differentiated by the full-wave differentiation circuits 126 and 128. The outputs of the full-wave differentiation circuits 126 and 128 which are as shown in FIGS. 6(c) and 6(d) are applied to an OR circuit 130 to obtain a logical sum. The output of the OR gate 130 which is as shown in FIG. 6(e) is the 4-stepped-up signal of the input signal Fa of the demodulating device 100. The signal thus obtained is applied to the trigger input terminal of an MM 132. The MM 132 then generates a pulse train which is as shown in FIG. 6(f) and is supplied to an LPF 134. the LPF 134 then produces a demodulated signal.

The conventional 4-step-up demodulating device is thus arranged to use a 90 degree phase shifter of the transversal filter type for twice stepping up a frequency modulated wave. The transversal filter has a frequency characteristic which is not flat as shown in FIG. 5(a). Therefore, the conventional device presents the following problem: Since the outputs Fx and Fy differ from each other in frequency characteristic, the component of 2 fc remains without being canceled by the 4-step-up process. This component, therefore, appears as a moiré on the picture plane in the case of a video signal. Further, since the outputs Fx and Fy have frequency characteristics, the demodulated signal also has a frequency characteristic, which causes the high band component of the signal to deteriorate. Although the filter characteristic can be arranged to be flat to solve that problem, such arrangement would result in an increase in manufacturing cost.

SUMMARY OF THE INVENTION

It is a general object of this invention to solve the above stated problems of the prior art.

It is a more specific object of the invention to provide a frequency demodulating device which is capable of producing an adequate demodulation output even in case that a frequency modulation carrier is at a low frequency.

It is another object of the invention to provide a frequency demodulating device which is capable of giving a demodulated signal of a flat frequency characteristic.

Under this object, a frequency demodulating device which is arranged as an embodiment of this invention comprises an analog multiplying circuit for receiving a frequency modulated signal as one of its input signals; means for generating another input signal of the analog multiplying circuit; a high-pass filter for receiving a signal produced from the analog multiplying circuit; and a frequency demodulation circuit for receiving a signal produced from the high-pass filter.

The above and further objects and features of this invention will become apparent from the following detailed description of embodiments thereof taken in connection with the accompanying drawings.

BRIEF DESCRIPTION OF THE DRAWINGS

FIGS. 10(a) to 10(d) show in a timing chart the wave forms of the signals produced from various parts of the device shown in FIG. 9.

DETAILED DESCRIPTION OF THE PREFERRED EMBODIMENTS

Figure 7:
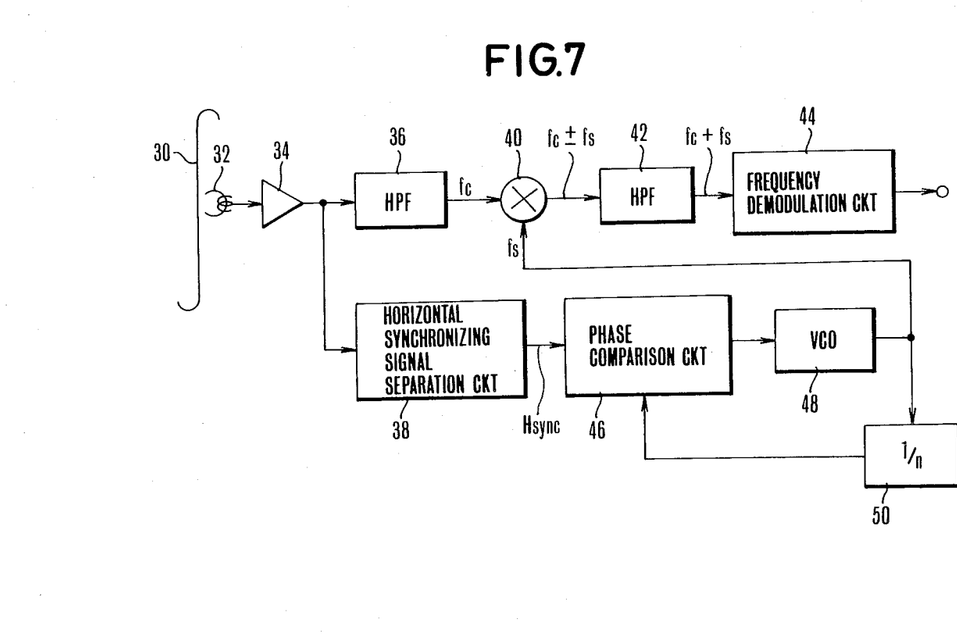
FIG. 7 is a diagram showing the arrangement of a frequency demodulating device arranged as an embodiment of this invention.

The following describes preferred embodiments of this invention with reference to the accompanying drawings, in which: FIG. 7 shows the arrangement of an embodiment wherein this invention is applied to an arrangement for reproduction of a video signal including a frequency modulated luminance signal component.

Referring to FIG. 7, the video signal which is recorded on a magnetic tape 30 is reproduced by a reproducing head 32. The reproduced signal is amplified by a reproduction amplifier 34. The output of the amplifier 34 is supplied to an HPF 36 and a horizontal synchronizing signal separation circuit 38. The HPF 36 produces a frequency modulated luminance signal (the lowest carrier frequency fc). The output of the HPF 36 is supplied to a balanced modulator 40 to be balance modulated with a carrier which is of a frequency fs. By this process, the time-base variations (hereinafter referred to as jitter) of the frequency modulated signal are also absorbed. The output of the balanced modulator 40 includes a component fc+fs and another component fc−fs as a result of the balanced modulation. The component fc+fs is taken out by an HPF 42 and is applied to a frequency demodulation circuit 44. This circuit 44 may be arranged to be of a counter type.

Figure 8A:
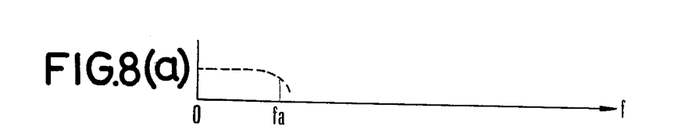
FIGS. 8(a) to 8(c) show the frequency spectra of signals produced from various parts of the device shown in FIG. 7.
Figure 8B:
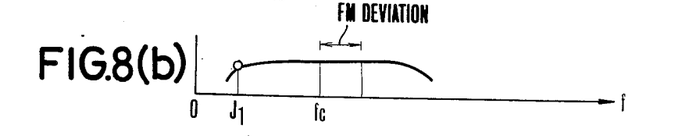
Figure 8C:
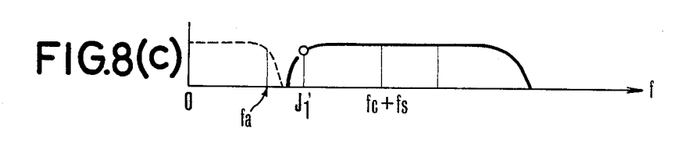

In case that the frequency demodulation circuit 44 is arranged to use either the rise or the fall of the frequency modulated signal, the carrier fs should be arranged to have the first lower-side wave J1' of the output of the HPF 42 not enter the band 0 to fa of the original signal. This can be expressed as J1'>fa, i.e., f3>2 fa−fc as shown in FIG. 8(c).

A phase comparison circuit 46, a voltage controlled oscillator (VCO) 48 and an 1/n frequency divider 50 jointly form a phase locked loop (hereinafter referred to as PLL). A horizontal synchronizing signal which is separated by the horizontal synchronizing signal separation circuit 38 is applied to one of the input terminals of the phase comparison circuit 46. The circuit 46 then produces a voltage, which is applied to the VCO 48 to control the oscillation frequency thereof. The output fs of the VCO 48 which is in synchronism with the horizontal synchronizing signal is supplied to the balanced modulator 40 and also to the 1/n frequency divider 50. The output of the frequency divider 50 has the same frequency as that of the horizontal synchronizing signal and is applied to the other input terminal of the phase comparison circuit 46.

In the case of this embodiment, the carrier to be used for balanced modulation is formed by taking out the horizontal synchronizing signal which serves as reference from the reproduced frequency modulated signal. Therefore, the jitter of the reproduced frequency modulated signal is absorbed when a frequency shift is effected by the balanced modulation. In reproducing a color video signal, the conventional device has presented a problem in that the luminance signal is left fully uncorrected while the jitter of the carrier chrominance signal is corrected. That problem is solved by this embodiment.

As apparent from the foregoing description, in accordance with the arrangement of the embodiment shown in FIG. 7, the lower-side wave which has a larger energy of the frequency modulated signal is prevented from mingling in the demodulated signal to distort the signal. Further, the arrangement of the embodiment obviates the necessity for use of a high speed frequency demodulation circuit.

Figure 9:
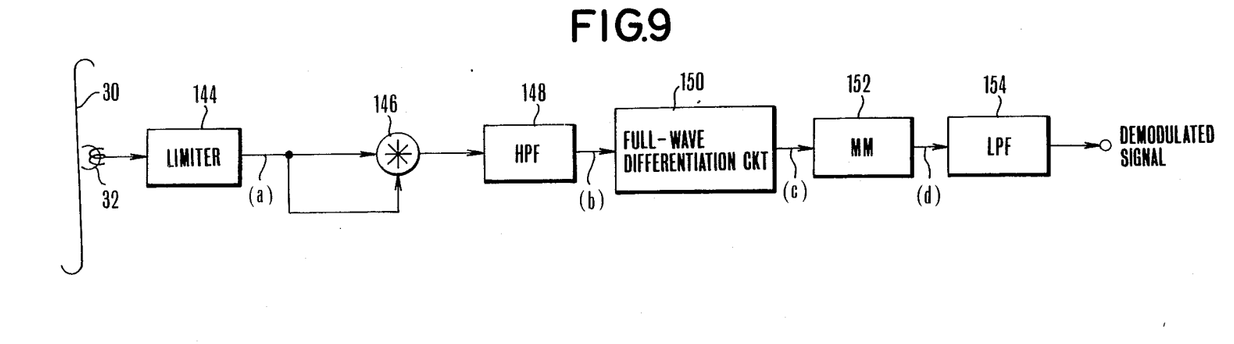
FIG. 9 is a diagram showing the arrangement of a frequency demodulating device arranged as another embodiment of the invention.

In another embodiment of this invention, the invention is applied to the luminance signal reproducing system of a VTR of the kind arranged to frequency modulate a luminance signal, to convert a carrier chrominance signal into a low frequency band and to perform multiplex recording. FIG. 9 shows the arrangement of the embodiment in a block diagram. FIGS. 10(a) to 10(d) show in a wave form chart the operation of the embodiment.

Figure 10A:
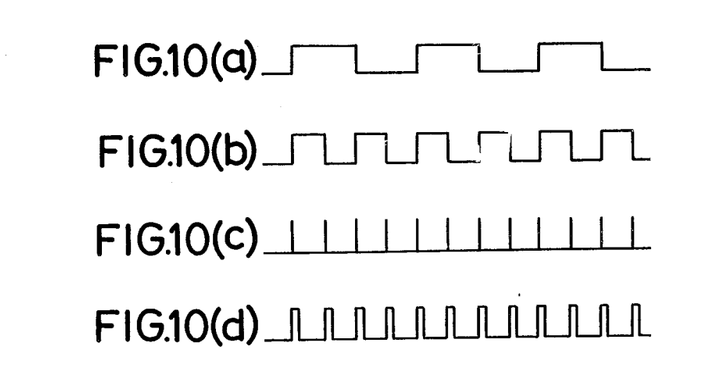

A frequency modulated luminance signal is recorded on a magnetic tape 30. A magnetic head 32 is arranged to convert a magnetic signal into an electrical signal. A limiter 144 is arranged to limit the amplitude of the frequency modulated luminance signal reproduced from the tape 30 by the magnetic head 32. The output of the limiter 144 which is as shown by way of example in FIG. 10(a) is applied to an analog multiplier 146 to be stepped up by two times. The output of the analog multiplier 146 is applied to an HPF 148 to remove the base band frequency component of the output. The output of the HPF 148 which is as shown in FIG. 10(b) is supplied to a full-wave differentiation circuit 150. The circuit 150 then performs full-wave differentiation to step up the output of the HPF 148 by two times. The output of the circuit 150 which is as shown in FIG. 10(c) is supplied to an MM 152 to trigger the latter. The MM 152 then produces a pulse train which has a given pulse width as shown in FIG. 10(d). The output of the MM 152 is supplied to an LPF 154 to have a high band component thereof removed by the LPF 154. A demodulated signal is thus produced from the LPF 154.

Compared with the twice stepping up action of the transversal filter, that of the analog multiplier 146 gives a flatter frequency characteristic and also has no group delay. Therefore, the demodulated signal has much less moiré and much less deterioration of the high band component thereof. The lower-side wave generated within the base band can be removed by the HPF 148. The moiré due to mingling of the lower-side wave also can be eliminated.

As apparent from the foregoing description, in accordance with this invention, a demodulated signal can be obtained without any mingling of a higher harmonic and without any substantial deterioration in the high band component of the signal. The invention thus has great practical advantages.

What is claimed is:

1. A frequency demodulating device comprising:
   (a) an analog multiplying circuit for receiving a frequency modulated signal as one of its input signal;
   (b) signal genrating means for generating another input signal of said analog multiplying circuit;
   (c) a high-pass filter for receiving a signal produced from said analog multiplying circuit; and
   (d) a frequency demodulation circuit for receiving a singla produced from said high-pass filter, said frequency demodulation circuit including a full-wave differentiation circuit which is arranged to receive the output signal of said high-pass filter.

2. A device according to claim 1, wherein said frequency demodulation circuit further includes a monostable multivibrator for receiving the output signal of said full-wave differentiation circuit and a low-pass filter for receiving the output signal of said monostable multivibrator.

3. A device according to claim 1, wherein said signal generating means is arranged to cause said frequency modulated signal to be supplied to said analog multiplying circuit as said other input signal.

4. A device according to claim 1, wherein said signal generating means is arranged to supply a signal of a given frequency including time-base variations corresponding to the time-base variations of said frequency modulated signal to said analog multiplying circuit as said other input signal of the latter.

5. A device according to claim 4, wherein said frequency modulated signal includes a frequency modulated video signal; and said signal generating means includes a separation circuit for separating a horizontal synchronizing signal from said video signal and a phase lock circuit for generating a signal phase locked to said horizontal synchronizing signal separated by said separation circuit.

6. A device according to claim 4, wherein said frequency modulated signal is obtained by frequency modulating an information signal having a maximum frequency fa with a carrier having a minimum frequency fc of deviation; and with said signal of the given frequency which is generated by said signal generating means assumed to be fs, there obtains the following relation: fs>2 fa−fc.

7. A frequency demodulating device comprising:
 (a) means for obtaining a frequency modulated signal by frequency modulating an information signal having a maximum frequency fa with a carrier having a minimum frequency fc of deviation;
 (b) frequency converting means for shifting the frequency of a frequency modulated signal to a higher band, said frequency converting means including a signal generating means for generating a signal of a given frequency fs, a balanced modulation circuit for modulating said signal of the given frequency generated by said signal generating means by said frequency modulated signal, and a high-pass filter for receiving the output signal of said balanced modulation circuit; and
 (c) a frequency demodulating circuit for frequency-demodulating the output signal of said frequency, the following relation applying among the frequencies fs, fa and fc: fs>2 fa−fc.

8. A device according to claim 7, wherein said signal generating means is arranged to supply said balanced modulation circuit with a signal of a given frequency including time-base variations corresponding to the time-base variations of said frequency modulated signal.

9. A device according to claim 8, wherein said frequency modulated signal includes a frequency modulated video signal; and said signal generating means includes a separation circuit for separating a horizontal synchronizing signal included in said video signal and a phase lock circuit for generating a signal which is phase locked to the horizontal synchronizing signal separated by said separation circuit.

10. A frequency demodulating device comprising:
 (a) a 2-step-up circuit for stepping up a frequency modulated signal by two times, said circuit including an analog multiplying circuit and a high-pass filter arranged to receive the output signal of said analog multiplying circuit; and
 (b) a frequency demodulation circuit for frequency-demodulating the output signal of said 2-step-up circuit.

11. A device according to claim 10, wherein said frequency demodulation circuit includes a full-wave differentiation circuit for receiving the output signal of said 2-step-up circuit.

12. A device according to claim 11, wherein said frequency demodulation circuit further includes a monostable multivibrator for receiving the output signal of said full-wave differentiation circuit and a low-pass filter for receiving the output signal of said monostable multivibrator.

* * * * *